United States Patent
Yasuda et al.

(10) Patent No.: US 10,261,532 B1
(45) Date of Patent: Apr. 16, 2019

(54) LOAD DRIVE CIRCUIT

(71) Applicant: ANDEN CO., LTD., Anjo, Aichi-pref. (JP)

(72) Inventors: Naoyuki Yasuda, Anjo (JP); Tomokatsu Fuseya, Anjo (JP); Manabu Morita, Anjo (JP)

(73) Assignee: ANDEN CO., LTD., Anjo, Aichi-pref. (JP)

( * ) Notice: Subject to any disclaimer, the term of this patent is extended or adjusted under 35 U.S.C. 154(b) by 0 days.

(21) Appl. No.: 16/106,742

(22) Filed: Aug. 21, 2018

(30) Foreign Application Priority Data

Nov. 27, 2017  (JP) .................................. 2017-227084

(51) Int. Cl.
| | | |
|---|---|---|
| *G05B 15/02* | (2006.01) | |
| *G05F 1/46* | (2006.01) | |
| *H01H 47/32* | (2006.01) | |
| *H03K 4/94* | (2006.01) | |
| *H03K 17/687* | (2006.01) | |
| *H03K 17/16* | (2006.01) | |

(52) U.S. Cl.
CPC ........... *G05F 1/468* (2013.01); *H01H 47/325* (2013.01); *H03K 4/94* (2013.01); *H03K 17/166* (2013.01); *H03K 17/6871* (2013.01)

(58) Field of Classification Search
CPC combination set(s) only.
See application file for complete search history.

(56) References Cited

U.S. PATENT DOCUMENTS

| | | | |
|---|---|---|---|
| 5,898,557 A * | 4/1999 | Baba | H03K 17/0822 |
| | | | 361/100 |
| 6,107,669 A | 8/2000 | Mokuya et al. | |
| 8,243,407 B2 * | 8/2012 | Fukami | H03K 17/0822 |
| | | | 361/78 |
| 10,120,355 B2 * | 11/2018 | Morita | G05B 19/042 |

FOREIGN PATENT DOCUMENTS

JP   H10-270632 A   10/1998

* cited by examiner

*Primary Examiner* — An T Luu
(74) *Attorney, Agent, or Firm* — Harness, Dickey & Pierce, P.L.C.

(57) ABSTRACT

A load drive circuit is configured to control driving of an electric load that is a direct current load, and includes a controller, a switching element, and a current detection portion. The controller generates and outputs a control signal for controlling a flowing state of a load current that flows to the electric load. The switching element switches flowing and interrupting of the load current based on the control signal. The current detection portion detects the load current. The controller includes a type determination portion and a control signal output portion. The type determination portion determines a type of the electric load based on the load current detected by the current detection portion. The control signal output portion generates and outputs the control signal based on the type determined by the type determination portion.

7 Claims, 4 Drawing Sheets

US 10,261,532 B1

LOAD DRIVE CIRCUIT

CROSS REFERENCE TO RELATED APPLICATIONS

The present application is based on and claims priority to Japanese Patent Application No. 2017-227084 filed on Nov. 27, 2017, the disclosure of which is incorporated herein by reference.

TECHNICAL FIELD

The present disclosure relates to a load drive circuit configured to control driving of an electric load.

BACKGROUND

A load drive circuit configured to control driving of an electric load is disclosed, for example, in JP 10-270632 A.

SUMMARY

In a conventional load drive circuit, it is necessary to individually set a control parameter according to a connected electric load. In this regard, there may be a case where various electric loads are mounted within one product (for example, a vehicle). In this case, conventionally, it is necessary to prepare a plurality of load drive circuits in which control parameters are individually set according to specifications of the electric loads within one product.

The present disclosure has been made in view of the circumstances exemplified above. That is, the present disclosure provides a general-purpose load drive circuit that can be adapted to various types of electric loads.

A load drive circuit according to an aspect of the present disclosure is configured to control driving of an electric load that is a direct current load, and includes a controller, a switching element, and a current detection portion. The controller generates and outputs a control signal for controlling a flowing state of a load current that flows to the electric load. The switching element switches flowing and interrupting of the load current based on the control signal. The current detection portion detects the load current. The controller includes a type determination portion and a control signal output portion. The type determination portion determines a type of the electric load based on the load current detected by the current detection portion. The control signal output portion generates and outputs the control signal based on the type determined by the type determination portion.

In such a configuration, the type determination portion determines the type of the electric load based on the load current detected by the current detection portion. The control signal output portion generates and outputs the control signal based on the type of the electric load determined by the type determination portion. The switching element switches flowing and interrupting of the load current based on the control signal.

As described above, in such a configuration, the control signal for switching flowing and interrupting of the load current can be generated correspondingly to the type of the electric load determined by the type determination portion. Thus, the load drive circuit can be provided as a general-purpose product that can be adapted to various electric loads.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Hereinafter, an embodiment will be described with reference to the drawings. Note that various modifications applicable to the embodiment are collectively described after explanation of the embodiment because understanding of the embodiment may be interfered when inserted in the middle of a series of explanations related to the embodiment.

(Configuration)

Figure 1:
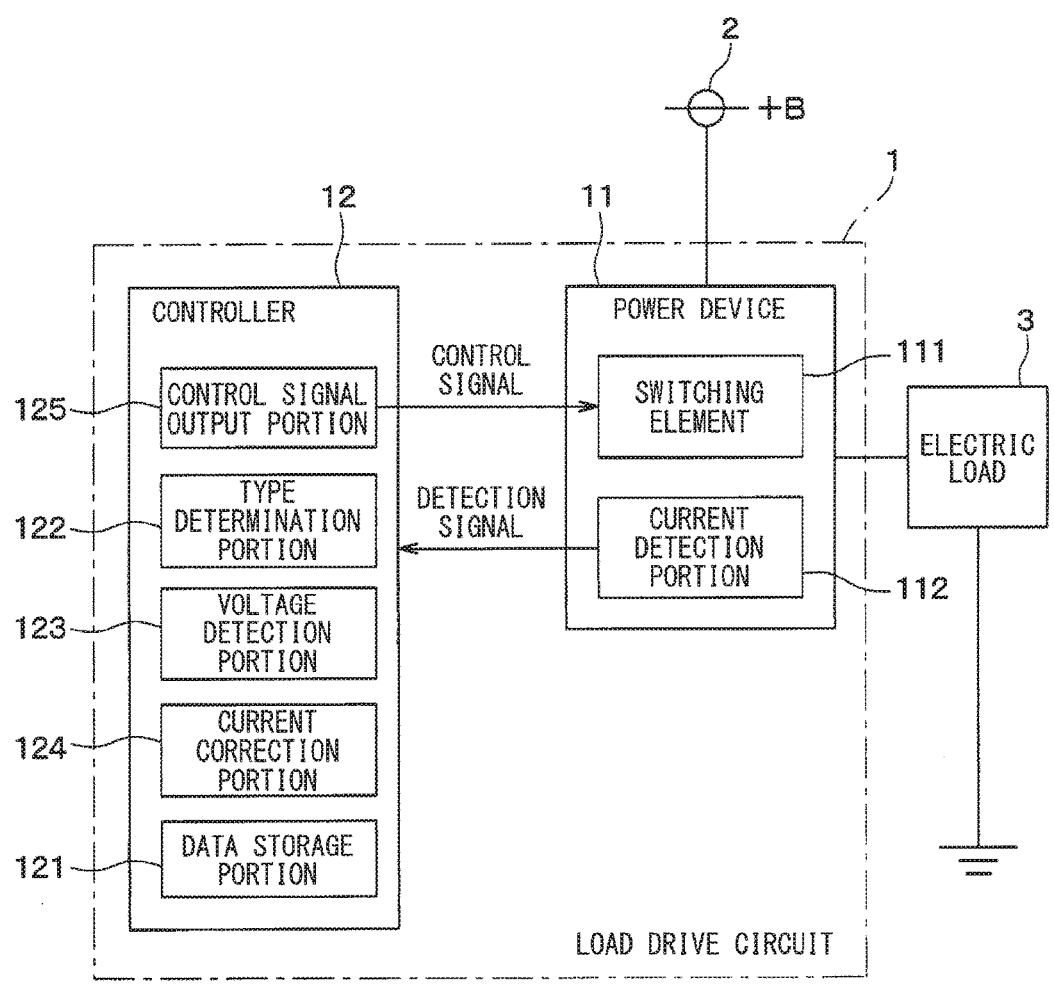
FIG. 1 is a schematic circuit diagram showing a configuration of a load drive circuit according to an embodiment.

As shown in FIG. 1, a load drive circuit 1 is provided between a direct current (DC) power supply 2 and an electric load 3 so as to control driving of the electric load 3 that is a DC load. The electric load 3 is, for example, a lamp, a resistor, a DC motor, or a solenoid.

In the present embodiment, the load drive circuit 1 is mounted on a vehicle (not shown). That is, the load drive circuit 1 is configured to control the supply of the load current from the DC power supply 2 that is an in-vehicle battery to the electric load 3 that is a DC load on the vehicle.

The load drive circuit 1 according to the present embodiment is a so-called semiconductor relay device, and includes a power device 11 and a controller 12. The power device 11 is a so-called intelligent power device, and includes a switching element 111 and a current detection portion 112.

The switching element 111 is a power semiconductor element provided inside the power device 11, and is configured by a metal-oxide semiconductor field-effect transistor (MOSFET), for example. The switching element 111 is disposed on a path through which the load current flows from the DC power supply 2 to the electric load 3. That is, the switching element 111 is configured so as to switch flowing and interrupting of the load current that flows from the DC power supply 2 to the electric load 3a based on a control signal input to a control terminal (i.e., a gate, for example).

The current detection portion 112 is provided so as to detect the load current. Specifically, the current detection portion 112 is configured to generate an electrical output (voltage, for example) corresponding to the load current.

The controller 12 is configured to generate and output a control signal for controlling a flowing state of the load current. Specifically, in the present embodiment, the control signal is a PWM control signal that on-off drives the switching element 111 by PWM control. The controller 12 includes a data storage portion 121, a type determination portion 122, a voltage detection portion 123, a current correction portion 124, and a control signal output portion 125.

Figure 2:
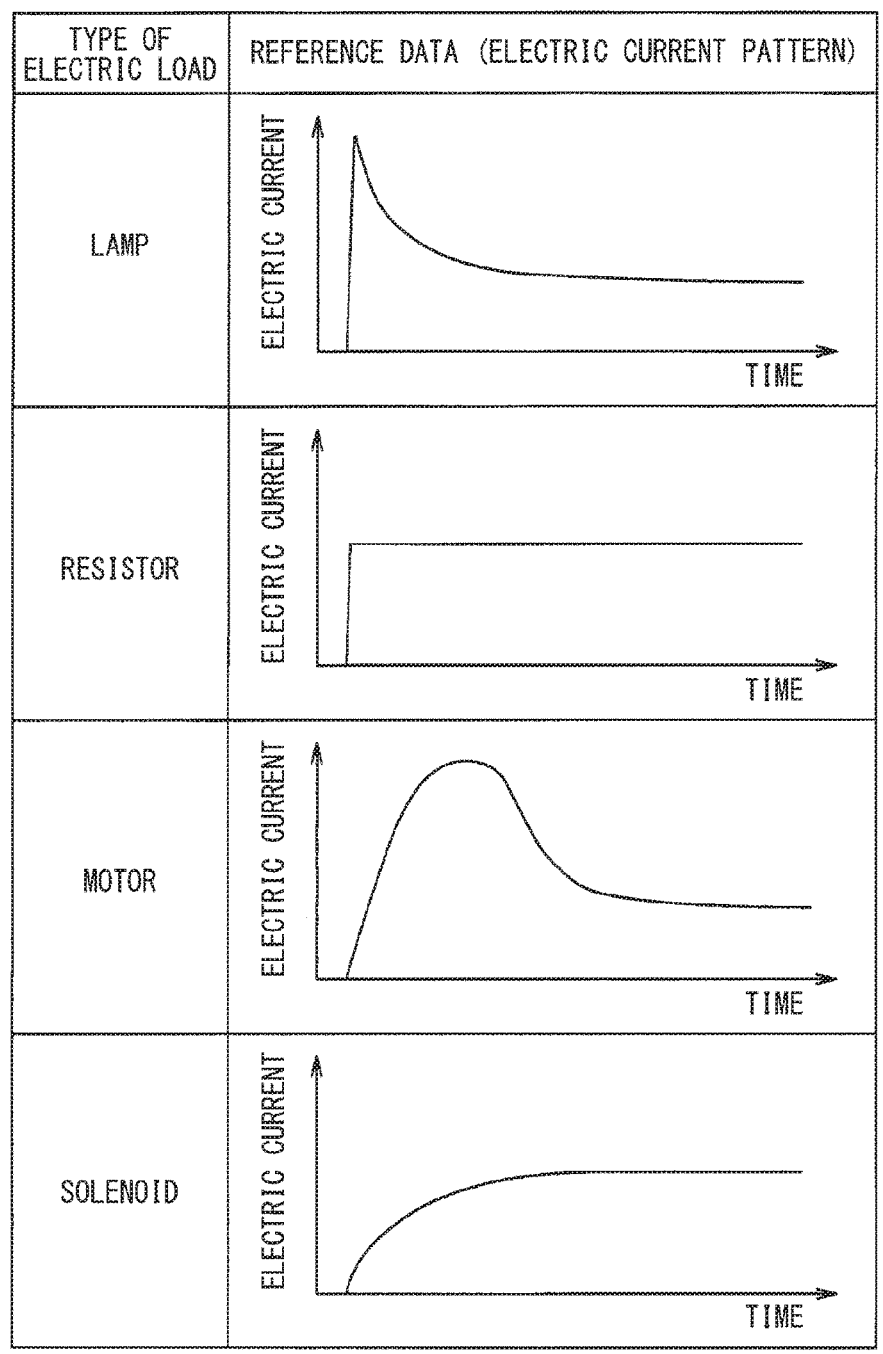
FIG. 2 is a diagram showing an example of reference data stored in a data storage portion shown in FIG. 1.

The data storage portion 121 is a rewritable nonvolatile memory. While the data storage portion 121 is capable of rewriting data when the power supply is on, the data storage portion 121 has a function of retaining the data after the power supply is cut off. In the data storage portion 121, as shown in FIG. 2, a reference data corresponding to a temporal change mode of the load current when the direct current is continuously supplied to the electric load 3 is stored for each type of the electric load 3.

The type determination portion 122 is configured to determine the type of the electric load 3 based on the load current detected by the current detection portion 112. In the present embodiment, the type determination portion 122 determines the type of the electric load 3 based on the load current detected by the current detection portion 112 during flow of a determination current to the electric load 3. The determination current is a direct current continuously supplied from the DC power supply 2 in order to determine the type of the electric load 3. Specifically, the type determination portion 122 is configured to determine the type of the electric load 3 based on the temporal change mode of the load current detected by the current detection portion 112 and the above-described reference data.

The voltage detection portion 123 is provided so as to detect a power supply voltage that is an output voltage of the DC power supply 2. Specifically, the voltage detection portion 123 outputs an electrical output corresponding to the power supply voltage (for example, a voltage obtained by dividing the power supply voltage by a predetermined ratio).

The current correction portion 124 is provided so as to correct the load current detected by the current detection portion 112 based on the power supply voltage. That is, the current correction portion 124 corrects the load current used for the type determination by the type determination portion 122 in accordance with the power supply voltage. Specifically, when the power supply voltage is higher than a reference voltage (for example, 12 V), the current correction portion 124 corrects the load current value to be low in accordance with a differential voltage from the reference voltage, while when the power supply voltage is lower than the reference voltage, the current correction portion 124 corrects the load current value to be high in accordance with a differential voltage from the reference voltage.

The control signal output portion 125 is configured to generate and output a control signal based on the type of the electric load 3 determined by the type determination portion 122. That is, the control signal output portion 125 sets a control parameter in the PWM control signal in accordance with the type of the electric load 3 determined by the type determination portion 122. The control parameter includes at least one of a duty, a frequency, and a rise time.

(Outline of Operation)

Hereinafter, an outline of an operation of the configuration according to the present embodiment will be described together with operational effects achieved by the configuration with reference to the respective drawings.

(Load Drive Operation)

First, a normal drive operation of the electric load 3 by the load drive circuit 1 will be described.

The controller 12 outputs the control signal to the switching element 111 based on a command signal received from an external source. That is, the control signal output from the controller 12 is input to the control terminal of the switching element 111. Then, a switching operation corresponding to the control signal is executed by the switching element 111. As a result, the switching element 111 switches flowing and interrupting of the load current based on the control signal.

(Control Parameter Setting Operation)

The electric load 3 in the present embodiment is a DC load operated by receiving power supply from the DC power supply 2, and is PWM driven based on the PWM control signal. The control parameter in the PWM control signal may differ according to the type of the electric load 3. Therefore, it is necessary to appropriately set the control parameter in the PWM control signal correspondingly to the type of the electric load 3.

The electric load 3 in the present embodiment is an in-vehicle load. Various types of electric loads 3 are mounted on the vehicle. If the load drive circuits 1 having different control parameter settings corresponding to the different types of electric loads 3 are individually prepared, the number of development man-hours and variations in the load drive circuits 1 increase.

In the present embodiment, the type determination portion 122 determines the type of the electric load 3 based on the load current detected by the current detection portion 112 during the flow of the determination current. In other words, the type determination portion 122 determines the type of the electric load 3 based on the load current corrected by the current correction portion 124. Specifically, the type determination portion 122 determines the type of the electric load 3 by comparing a temporal change mode of a value that is obtained by correcting the load current detected by the current detection portion 112 by the current correction portion 124 with the reference data stored in the data storage portion 121 in advance.

More specifically, the type determination portion 122 samples the output of the current detection portion 112, that is, the load current during the flow of the determination current at a predetermined sampling interval. The sampling interval is a short interval to a degree to which the characteristic corresponding to the type of the electric load 3 appears in a waveform of the load current (for example, 1 millisecond).

The type determination portion 122 continues sampling the load current until the load current during the flow of the determination current becomes steady. Accordingly, the load current characteristic is acquired. The load current characteristic is a characteristic in the waveform of the load current during the flow of the determination current. Specifically, the load current characteristic includes, for example, the presence or absence of an inrush current, duration of the inrush current, a steady current value, and a time from an energization start until the load current becomes steady. In the present embodiment, the load current characteristic is corrected according to the power supply voltage. The type determination portion 122 determines the type of the electric load 3 by comparing the acquired load current characteristic with the reference data stored in the data storage portion 121.

After determining the type of the electric load 3, the control signal output portion 125 generates and outputs the control signal using the control parameter corresponding to the type of the electric load 3 determined by the type determination portion 122. That is, the control signal for switching flowing and interrupting of the load current is generated correspondingly to the type of the electric load 3 determined by the type determination portion 122. As a result, an appropriate drive control of the electric load 3 adapted to the type of the electric load 3 that is actually electrically connected to the load drive circuit 1 is executed.

Figure 3:
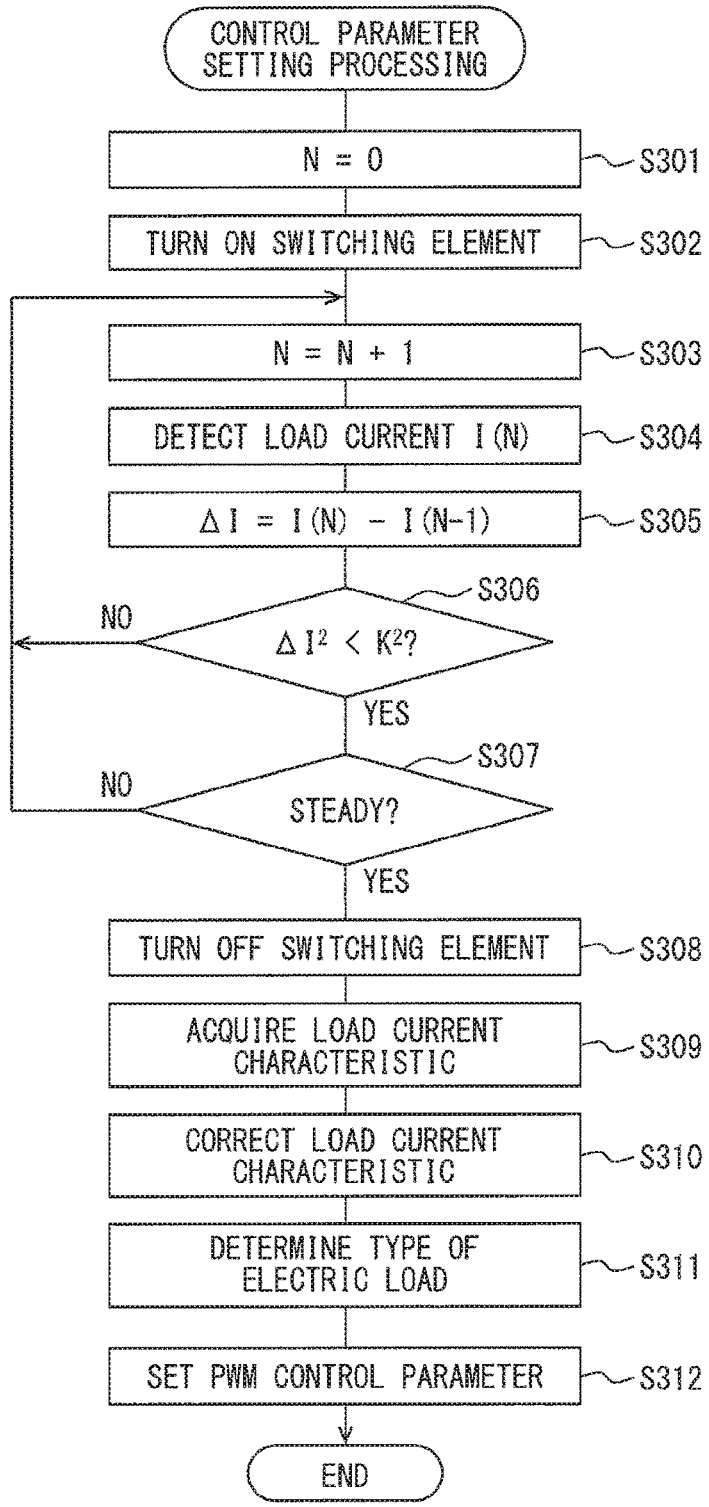
FIG. 3 is a flowchart showing an example of a control parameter setting processing performed by the load drive circuit shown in FIG. 1.

FIG. 3 shows an example of a control parameter setting processing in the load drive circuit 1. In the drawings and the following description in the specification, "step" is simply abbreviated as "S".

The load drive circuit 1 executes the control parameter setting processing shown in FIG. 3 at a predetermined timing. For example, the control parameter setting processing is forcibly executed by an external operation at a shipment inspection of the vehicle. In addition, the control parameter setting processing may be performed periodically, or may be executed when a specific condition (for example, an ignition switch of the vehicle is tuned on) is established.

When the control parameter setting processing shown in FIG. 3 is started, first, the load drive circuit 1 resets a counter N (that is, N=0) at S301. Next, at S302, the load drive circuit 1 turns on the switching element 111 to start flowing of the determination current. Subsequently, the load drive circuit 1 repeatedly executes the processing of S303 to S307 until the load current becomes steady.

At S303, the load drive circuit 1 increments the counter N by 1. At S304, the load drive circuit 1 detects the load current and stores the detection value as I(N). At S305, the load drive circuit 1 calculates a change amount $\Delta I$ of the current detection value I(N) from the previous value I(N−1). In the case of N=1, since the previous value does not exist, the change amount $\Delta I$ is equal to the current detection value I(1).

At S306, the load drive circuit 1 determines whether the square of the change amount $\Delta I$ calculated this time is smaller than the square of a predetermined value K. This determination corresponds to whether the absolute value of the change amount $\Delta I$ calculated this time is smaller than a predetermined threshold value.

When the absolute value of the change amount $\Delta I$ calculated this time is equal to or larger than the threshold value (S306=NO), it is clear that the load current is not steady, and the load current characteristic cannot be acquired yet. Therefore, the load drive circuit 1 returns the processing to S303. On the other hand, when the absolute value of the change amount $\Delta I$ calculated this time is smaller than the threshold value (S306=YES), the load drive circuit 1 advances the processing to S 307.

At S307, the load drive circuit 1 determines whether the load current has become steady. Specifically, the load drive circuit 1 determines whether the state in which the absolute value of the change amount $\Delta I$ is smaller than the threshold value has continued for a predetermined number of times or for a predetermined time period.

When the load current is not steady (S307=NO), the load drive circuit 1 returns the processing to S303. On the other hand, when the load current becomes steady (S307=YES), the load drive circuit 1 executes the processing of S308 to S312, and then ends the control parameter setting processing.

At S308, the load drive circuit 1 turns off the switching element 111 to end the flow of the determination current. At S309, the load drive circuit 1 acquires the load current characteristic based on the stored detection values I(1) to I(N). At S310, the load drive circuit 1 corrects the load current characteristic according to the power supply voltage by the current correction portion 124.

Figure 4:
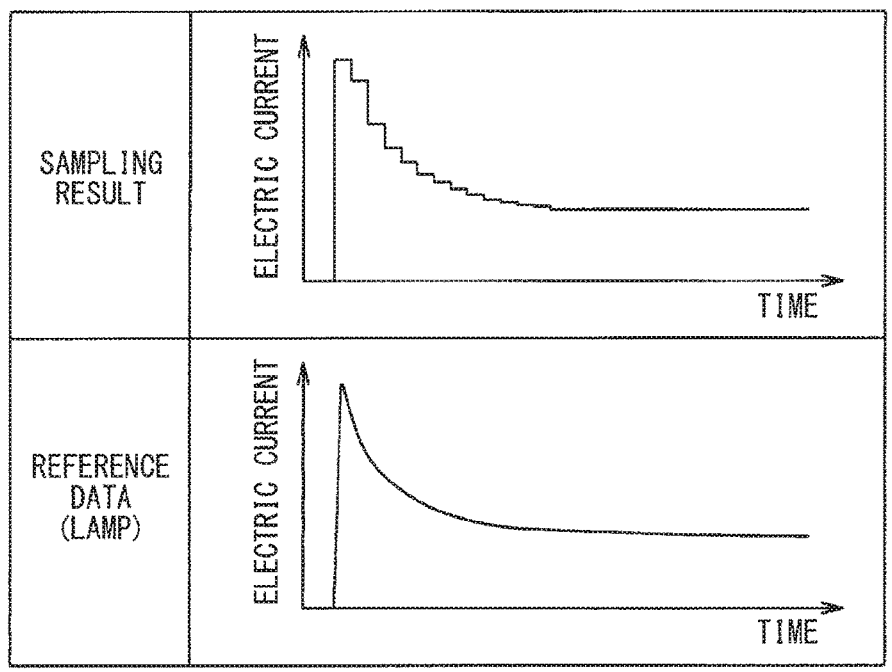
FIG. 4 is a diagram showing a sampling result of a detection value and a reference data corresponding to a lamp.

At S311, the load drive circuit 1 determines the type of the electric load 3 by comparing the acquired load current characteristic with the reference data stored in the data storage portion 121. FIG. 4 shows the sampling result of the detection values I(1) to I(N) and the reference data corresponding to a lamp in a case where the electric load 3 is the lamp. In this way, by appropriately setting the sampling interval, the type determination of the electric load 3 can be satisfactorily performed. At S312, the load drive circuit 1 sets the control parameter in the PWM control signal based on the determined type of the electric load 3.

As described above, even if the control parameter is not set before the load drive circuit 1 is mounted on the vehicle, the load drive circuit 1 can execute an appropriate load drive operation autonomously by being activated once in the on-vehicle state. Therefore, the load drive circuit 1 can be provided as a general-purpose product that can be adapted to various electric loads 3.

(Modifications)

The present disclosure is not limited to the specific examples described in the above-described embodiment. That is, it is possible to appropriately change the above-described embodiment. Representative modifications will be described below. In the following description of modifications, only parts different from the above-described embodiment will be described. In addition, in the above-described embodiment and the modifications, the same reference numerals are given to the same or equivalent parts. Therefore, in the description of the following modifications, regarding elements having the same reference numerals as the elements of the above-described embodiment, the description in the above-described embodiment can be appropriately cited unless there is a technical inconsistency or a specific additional explanation.

The present disclosure is not limited to the specific examples described in the above-described embodiment. For example, all or a part of the load drive circuit 1 may be configured as an in-vehicle microcomputer including a CPU, a ROM, a RAM, and a rewritable nonvolatile memory, for example. Alternatively, all or a part of the load drive circuit 1 may be configured as an application specification integrated circuit (ASIC) such as a gate array.

In the above-described embodiment, the switching element 111 and the current detection portion 112 are integrated as a power device 11 that is one semiconductor element. However, the present disclosure is not limited to such aspects. In addition, the current detection method by the current detection portion 112 can also be appropriately selected from well-known techniques.

The power device 11 and the controller 12 may be integrated as one semiconductor element.

The data storage portion 16 may be a database provided outside the load drive circuit 1.

The voltage detection portion 123 and the current correction portion 124 may be provided outside the controller 12.

The correction of the load current value by the current correction portion 124 may be performed between S304 and S305. In this case, S310 is omitted.

The correction of the load current value according to the power supply voltage by the current correction portion 124 may be omitted.

The constituent element(s) of each of the above embodiments is/are not necessarily essential unless it is specifically stated that the constituent element(s) is/are essential in the above embodiments, or unless the constituent element(s) is/are obviously essential in principle. In addition, in the case where the number of the constituent element(s), the value, the amount, the range, and/or the like is specified, the present disclosure is not necessarily limited to the number of the constituent element(s), the value, the amount, and/or the like specified in the embodiment unless the number of the constituent element(s), the value, the amount, and/or the like is indicated as essential or is obviously essential in view of the principle. Similarly, in the case where the shape, the direction, the positional relationship, and/or the like of the constituent element(s) is specified, the present disclosure is not necessarily limited to the shape, the direction, the positional relationship, and/or the like unless the shape, the direction, the positional relationship, and/or the like is/are indicated as essential or is/are obviously essential in principle.

The modifications are not limited to the above-described examples. A plurality of modifications may be combined with each other. Furthermore, all or a part of the above-described embodiments and all or a part of the modifications may be combined with each other.

What is claimed is:

1. A load drive circuit configured to control driving of an electric load that is a direct current load, comprising:
    a controller generating and outputting a control signal for controlling a flowing state of a load current that flows to the electric load;
    a switching element switching flowing and interrupting of the load current based on the control signal; and
    a current detection portion detecting the load current, wherein
    the controller includes a type determination portion and a control signal output portion,
    the type determination portion determines a type of the electric load based on the load current detected by the current detection portion, and
    the control signal output portion generates and outputs the control signal based on the type determined by the type determination portion.

2. The load drive circuit according to claim 1, further comprising
    a current correction portion correcting the load current detected by the current detection portion based on a power supply voltage, wherein
    the type determination portion determines the type based on the load current corrected by the current correction portion.

3. The load drive circuit according to claim 1, wherein
    the type determination portion determines the type based on the load current detected by the current detection portion during flow of a determination current that is a direct current continuously flowing to the electric load.

4. The load drive circuit according to claim 1, wherein
    the control portion further includes a data storage portion that stores a reference data corresponding to a temporal change mode of the load current for each of the types, and
    the type determination portion determines the type based on the temporal change mode of the load current detected by the current detection portion and the reference data.

5. The load drive circuit according to claim 1, wherein
    the control signal is a PWM control signal that on-off drives the switching element by PWM control, and
    the control signal output portion sets at least one of a duty, a frequency, and a rise time of the PWM control signal based on the type determined by the type determination portion.

6. The load drive circuit according to claim 1, wherein
    the switching element is disposed on a path of the load current from a direct current power supply to the electric load.

7. The load drive circuit according to claim 1, wherein
    the electric load is an in-vehicle load.

* * * * *